United States Patent [19]

Rinderle

[11] Patent Number: 4,613,824

[45] Date of Patent: Sep. 23, 1986

[54] SELECTIVE AMPLIFIER HAVING COMMON BASE CONNECTED TRANSISTOR AND INDUCTIVE INPUT SIGNAL COUPLING

[75] Inventor: Heinz Rinderle, Heilbronn, Fed. Rep. of Germany

[73] Assignee: Telefunken electronic GmbH, Heilbronn, Fed. Rep. of Germany

[21] Appl. No.: 671,424

[22] Filed: Nov. 14, 1984

[30] Foreign Application Priority Data

Dec. 16, 1983 [DE] Fed. Rep. of Germany ....... 3345496

[51] Int. Cl.⁴ ............................................. H03F 3/191

[52] U.S. Cl. .................................... 330/302; 330/305

[58] Field of Search ............... 330/302, 303, 304, 305, 330/306

[56] References Cited

U.S. PATENT DOCUMENTS 2,920,277 1/1960 Overbeek ........................... 330/306

3,001,146 9/1961 Knol et al. ......................... 330/302

FOREIGN PATENT DOCUMENTS 1177219 9/1964 Fed. Rep. of Germany .

1183554 12/1964 Fed. Rep. of Germany .

*Primary Examiner*—Eugene R. LaRoche
*Assistant Examiner*—Steven J. Mottola
*Attorney, Agent, or Firm*—Spencer & Frank

[57] ABSTRACT

In a selective amplifier stage with a frequency-selective input filter to which there is coupled inductively an amplifier transistor, there is provided for the inductive coupling of the amplifier transistor to the filter a coil which is magnetically coupled to the coil of the input filter. The coupling coil is of such dimensions that when the input filter is aligned to maximum amplification of the stage, the source impedance driving the transistor is greater than the input impedance of the amplifier transistor.

7 Claims, 9 Drawing Figures

2
1
3
4
5
18
PRIOR ART 7
2
1
3
4
5
6
8
18
9
10
PRIOR ART 1
3
5
2'
18

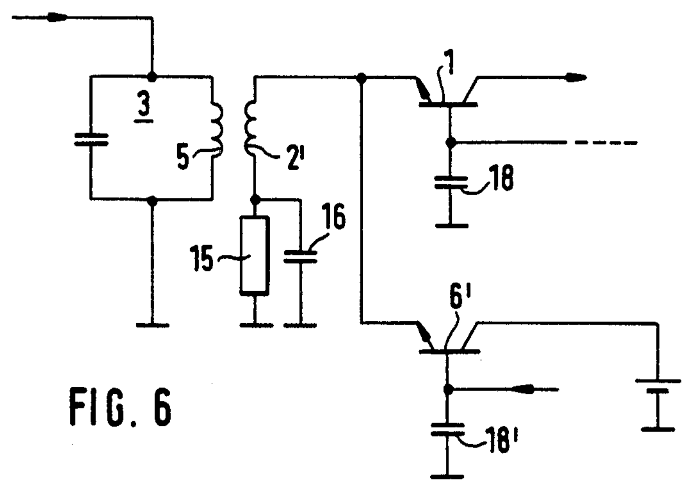
FIG. 6
FIG. 7
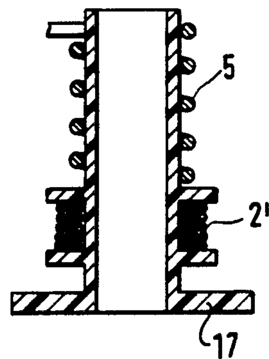
FIG. 8
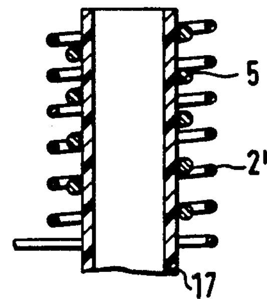

SELECTIVE AMPLIFIER HAVING COMMON BASE CONNECTED TRANSISTOR AND INDUCTIVE INPUT SIGNAL COUPLING

BACKGROUND OF THE INVENTION

The invention relates to a selective amplifier stage with a frequency-selective input filter to which there is coupled inductively an amplifier transistor, wherein the input impedance of the amplifier transistor is smaller than the source impedance driving it at the operating frequency.

Such selective amplifier stages are known. The input impedance of the amplifier transistor in such a selective amplifier stage is smaller than the source impedance driving it when the amplifier transistor is operated using a bipolar transistor as amplifier transistor in common base circuit and using a field-effect transistor as amplifier transistor in common gate circuit. In selective amplifier stages wherein the amplifier transistor is operated in common base circuit or in common gate circuit, respectively, with the input impedance of the amplifier transistor consequently being smaller than the source impedance driving it, the coil required for coupling the amplifier transistor to the input filter is not coupled magnetically to the filter coil, and is, therefore, also not arranged together with the filter coil on a common coil carrier. For, the opinion prevails that when the amplifier transistor is operated in common base circuit or in common gate circuit, respectively, it is not possible to use the magnetic coupling of the coupling coil to the filter coil, customary in other basic circuits such as common emitter or source circuits because the low ohmic input impedance of the amplifier transistor is damping the input filter too much in a common base or common gate circuit, respectively, thus lowering the selectivity of the input filter accordingly. On the other hand, however, a magnetic coupling of the coupling coil to the filter coil is desirable because this solution is more space-saving and also more cost-efficient than a non-magnetic coupling of the amplifier transistor to the input filter.

SUMMARY OF THE INVENTION

The object underlying the invention is to provide a solution enabling magnetic coupling of the coupling coil to the filter coil of the input filter of the selective amplifier stage without causing strong damping of the input filter, also when the amplifier transistor is operated in common base or common gate circuit, respectively.

According to the invention there is provided in a selective amplifier stage for inductively coupling the amplifier transistor to the filter, a coil which is magnetically coupled to the coil of the input filter, wherein the inductivity of the coupling coil is greater than the inductivity of the filter coil, and the coupling coil is of such dimensions that the source impedance driving the transistor is greater than the input impedance of the amplifier transistor when the input filter is aligned to maximum amplification of the stage.

The noise factor and the power amplification of the amplifier stage are set by the magnetic coupling between the two coils. By means of the coupling between the two coils it is also possible to arrive at a compromise between optimal noise factor and optimal power amplification. A compromise is preferred because with optimal noise factor setting, the power amplification of the stage is generally insufficient. It is furthermore recommendable to provide the inductivity of the coupling coil with such dimensions that there is noise tuning at the input of the amplifier stage. What is meant by this is that the phase of the source impedance is tuned so as to ensure that the noise factor becomes minimal at a predetermined source impedance.

Such setting is necessary, for example, when capacitances adversely affecting the phase of the source impedance for the signal frequency become effective parallel to the transistor input.

BRIEF DESCRIPTION OF THE DRAWINGS

The invention will now be described in greater detail, by way of examples, with reference to the drawings, in which.

Figure 5:
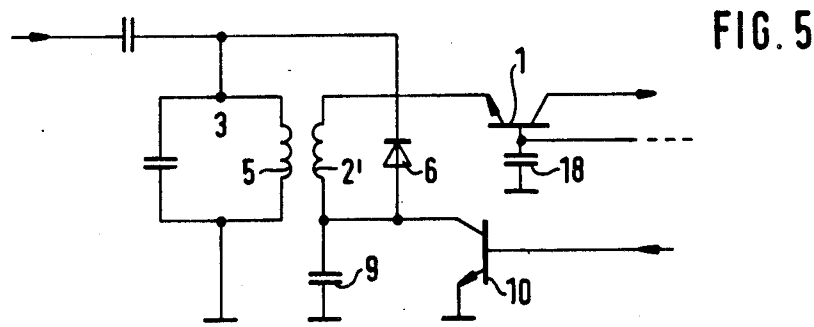

FIG. **4*a*** shows a definition of the source impedance;

FIG. **4*b*** shows the path of the source impedance in dependence upon the signal frequency;

FIG. 5 shows an amplifier stage with additional amplification control;

FIG. 6 shows an amplification control with a transistor;

FIG. 7 shows the magnetic coupling between the coupling coil and the filter coil.

FIG. 8 shows a modified coil structure.

DESCRIPTION OF THE PREFERRED EMBODIMENTS

Figure 1:
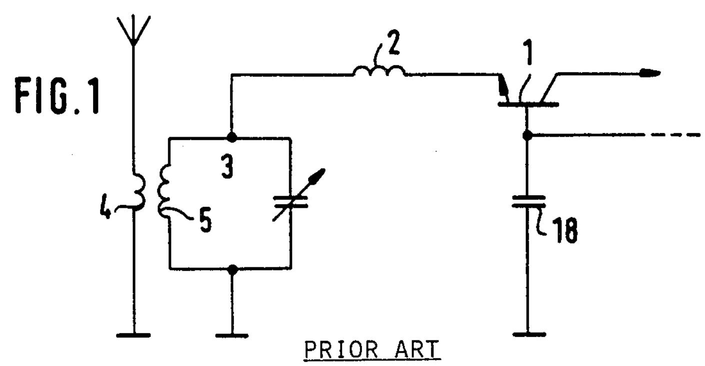
FIG. 1 shows a known selective amplifier stage.
Figure 2:
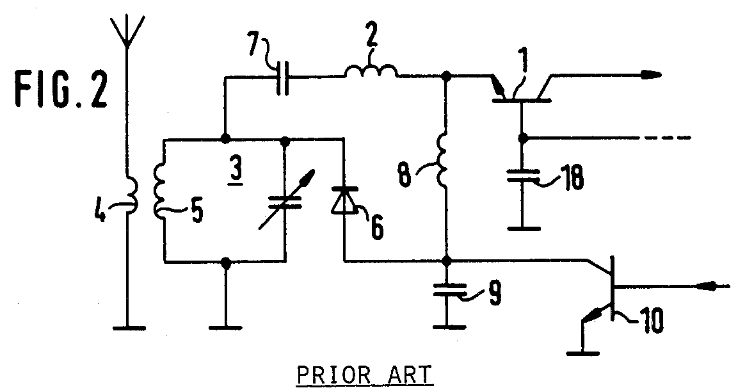
FIG. 2 shows another known selective amplifier stage.

FIGS. 1 and 2 show two known selective amplifier stages which are used, for example, in VHF radio receivers. FIG. 1 shows a known selective amplifier stage in the simplest form wherein a bipolar amplifier transistor 1 in common base circuit is coupled inductively to the tunable tuning circuit or input filter 3 via a coil 2. The received signal is fed to the input filter 3 via a coupling coil 4. Between the base of transistor 1 and the reference potential there is a capacitor 18 which constitutes a short circuit for the operating frequency. The base of transistor 1 is fed the required base potential. The coil 2 is not magnetically coupled to the coil 5 of the input filter in order to avoid substantial damping of the filter 3 by the low input impedance of transistor 1. The coil 2 in known arrangements is of such dimensions that there is almost noise-optimal matching of transistor 1 to filter 3. This type of circuitry and type of coil dimensioning ensure that when the input filter 3 is aligned, maximum amplification and minimal noise (noise factor) concur.

The known arrangement of FIG. 2 differs from the arrangement in FIG. 1 in that the amplification is controllable. In the arrangement of FIG. 2, there are provided for the purpose of amplification control a PIN diode 6, a direct-current separator capacitor 7, a coil 8, a blocking capacitor 9 and also a control transistor 10. The effect of the amplification control is based on the fact that the current flowing through the PIN diode 6 is controlled by the control transistor 10 whose base is fed by a control potential. This current control effects a control of the resistance of the PIN diode 6. The filter 3 is damped to varying degrees in accordance with the AC resistance of the PIN diode, which, in turn, results in a corresponding change of amplification of the circuit.

Figure 3:
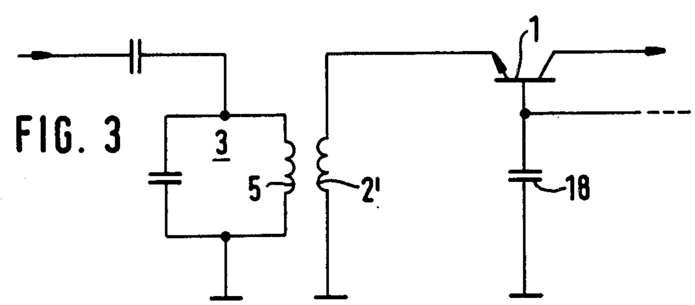
FIG. 3 shows a selective amplifier stage according to the invention.
Figure 4A:
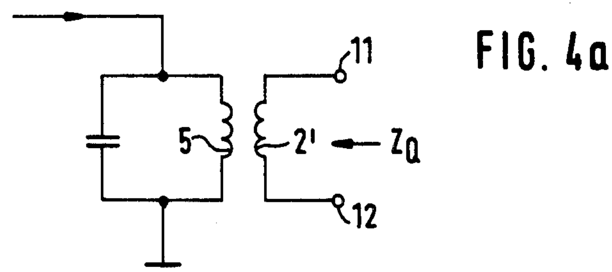
Figure 4B:
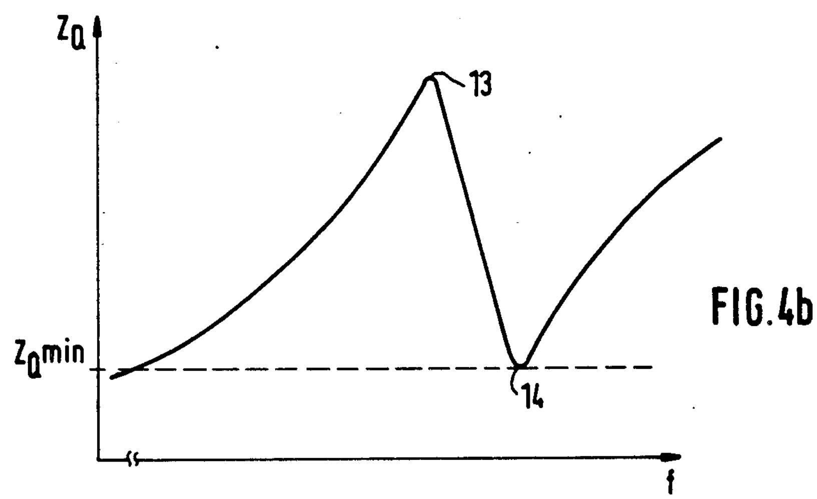

FIG. 3 shows, contrary to FIGS. 1 and 2, a selective amplifier stage according to the invention. In the case of the amplifier stage shown in FIG. 3, the amplifier transistor 1 is coupled magnetically via the coupling coil 2' to the filter coil 5, and the signal current is fed to the input filter via a capacitor or directly. Such a magnetic coupling is, however, only possible in the circuit shown in FIG. 3, in which the amplifier transistor 1 is operated in common base circuit, if certain preconditions such as selectively and noise factor are to be fulfilled, if, in accordance with the invention, the coupling coil 2' is of such dimensions that the inductivity of the coupling coil 2' is greater than the inductivity of the filter coil 5, and, when the input filter is aligned to maximum stage amplification, the source impedance driving the transistor is greater than the input impedance of the amplifier transistor 1. In this context, attention is drawn to FIG. 4, whose FIG. 4*a* shows a definition of the source impedance $Z_Q$, and whose FIG. 4*b* shows the path of the source impedance $Z_Q$ in dependence upon the signal frequency f. The source impedance $Z_Q$ driving the transistor 1 between its emitter and the reference potential is, according to FIG. 4*a*, the impedance which is effective between the points 11 and 12 of the coupling coil 2'. The $Z_Q$ curve has a maximum 13 and a minimum 14 according to FIG. 4*b*. While in the case of the known amplifier stages with magnetic coupling (common emitter circuit) the circuit is usually operated in such a way that the maximum 13 of the source impedance $Z_Q$ occurs during the operating frequency, the circuit according to the invention which likewise features magnetic coupling, but in combination with a common base circuit, is operated in such a way that the minimum 14 of the source impedance $Z_Q$ is present during the operating frequency. Such a setting is obtained by appropriate dimensioning of the inductivity of the coupling coil 2' and by appropriate setting of the coupling degree between the coupling coil 2' and the filter coil 5. Thus, for example, the minimum 14 of the source impedance $Z_Q$ may be selected in such a way as to ensure noise matching between the input filter 3 and the transistor 1. Noise matching exists whenever the noise factor of the amplifier stage arrives at a minimum in dependence upon the source impedance $Z_Q$. In practical application, however, as previously mentioned, it is generally expedient not to set noise matching, but rather to select the minimum source impedance in such a way as to arrive at a compromise between noise matching and power matching.

A further reduction of the noise factor may be achieved by a certain phase adjustment of the source impedance $Z_Q$, for example, by selection of the inductivity of the coupling coil 2'. Such a phase adjustment is known as noise tuning.

The amplifier stage shown in FIG. 5 comprises, in addition, an amplification control as described in connection with FIG. 2. As a comparison between FIGS. 2 and 5 shows, the circuit of FIG. 5 requires as a consequence of the invention, less components than the known circuit shown in FIG. 2.

The amplifier stage of FIG. 6 differs from the amplifier stage of FIG. 5 in that instead of a PIN diode 6 there is provided for amplification control a transistor 6' which is connected in parallel with transistor 1 for the signal frequency. Transistor 6' is controlled by the control signal at its base. Amplification control in the circuit of FIG. 6 is effected by the transistor 6' taking over the emitter current from the amplifier transistor 1. The resistor 15 which is bridged by the capacitor 16 for the signal frequency enables the above-mentioned taking over of the emitter current when the base of the transistor 6' is controlled.

FIG. 7 shows a practical embodiment of the magnetic coupling between the coupling coil 2' and the filter coil 5. In accordance therewith, the coil 2' and the coil 5 are located on a common carrier 17. While the coils 2' and 5 of the arrangement of FIG. 7 are superimposed, the two coils in the arrangement according to FIG. 8 are positioned concentrically with respect to each other, and are consequently nested within each other. The magnetic coupling degree according to the invention is adjustable by the geometric arrangement and shape of the filter coil 5 and the coupling coil 2'. The filter coil arrangement may, for example, comprise an adjustable RF iron core for the alignment of the filter 3 to the operating frequency.

What is claimed is:

1. A selective amplifier stage comprising: a tunable frequency-selective input filter having a filter coil; an amplifier transistor having an input impedance; and coupling means inductively coupling the amplifier transistor to the input filter, the input filter and the coupling means having a source impedance measured across the coupling means, wherein the input impedance of the amplifier transistor is smaller than the source impedance controlling it at the operating frequency, wherein said inductive coupling means comprise a coupling coil which is magnetically coupled to the filter coil, wherein the coupling coil is of such dimensions that when the input filter is aligned to maximum amplification of the stage, the source impedance driving the amplifier transistor is greater than the input impedance of the amplifier transistor, and wherein tuning of the input filter causes the source impedance to vary with tuning frequency and said coupling coil is given an inductance and the coupling factor between said coupling coil and filter coil is selected for causing the source impedance to have a minimum value when said input filter is tuned to the operating frequency.

2. A selective amplifier stage according to claim 1, wherein the noise factor and the power amplification of the stage are set by the magnetic coupling between the two coils.

3. A selective amplifier stage according to claim 1, wherein a compromise between optimal noise factor and optimal power amplification is achieved by the coupling between the two coils.

4. A selective amplifier stage according to claim 1, wherein the inductivity of the coupling coil is of such dimensions as to ensure noise tuning between the input filter and the amplifier transistor.

5. A selective amplifier stage according to claim 1, wherein the two coils are arranged on a common carrier.

6. A selective amplifier stage according to claim 1, wherein the coils are of alignable design.

7. A selective amplifier stage operative to produce power amplification with a noise factor, said stage comprising: a frequency-selective input filter having a filter coil; an amplifier transistor having an input impedance; and coupling means inductively coupling the amplifier transistor to the input filter, the input filter and the coupling means having a source impedance measured across the coupling means, wherein the input impedance of the amplifier transistor is smaller than the source impedance controlling it at the operating frequency, wherein said inductive coupling means comprise a coupling coil which is magnetically coupled to the filter coil, wherein the coupling coil is of such dimensions that when the input filter is aligned to maximum amplification of the stage, the source impedance driving the amplifier transistor is greater than the input impedance of the amplifier transistor, and wherein the coupling between said coupling coil and said filter coil is set for achieving a compromise between optimal noise factor and optimal power amplification.

* * * * *